(12) United States Patent
Ong et al.

(10) Patent No.: US 12,051,581 B2
(45) Date of Patent: Jul. 30, 2024

(54) POWER SUPPLY MODULE AND MASS SPECTROMETER

(71) Applicant: Hitachi High-Tech Corporation, Tokyo (JP)

(72) Inventors: Zihao Ong, Tokyo (JP); Takuma Nishimoto, Tokyo (JP); Isao Furuya, Tokyo (JP); Hiroshi Touda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/768,934

(22) PCT Filed: Sep. 4, 2020

(86) PCT No.: PCT/JP2020/033669
§ 371 (c)(1),
(2) Date: Apr. 14, 2022

(87) PCT Pub. No.: WO2021/075171
PCT Pub. Date: Apr. 22, 2021

(65) Prior Publication Data
US 2024/0105436 A1    Mar. 28, 2024

(30) Foreign Application Priority Data
Oct. 18, 2019    (JP) .................. 2019-190656

(51) Int. Cl.
*H01J 49/02* (2006.01)
*H02M 3/24* (2006.01)

(52) U.S. Cl.
CPC ............. *H01J 49/022* (2013.01); *H02M 3/24* (2013.01)

(58) Field of Classification Search
CPC ........ H01J 49/022; H01J 49/025; H01J 49/10; H01J 49/26; H01J 49/42; H02M 3/24;
(Continued)

(56) References Cited

U.S. PATENT DOCUMENTS 6,907,206 B2    6/2005    Hattori et al.
9,888,596 B2    2/2018    Momose
(Continued)

FOREIGN PATENT DOCUMENTS

JP    H0799777 A    4/1995
JP    H11176479 A    7/1999
(Continued)

OTHER PUBLICATIONS

Search Report mailed Oct. 27, 2020 in International Application No. PCT/JP2020/033669.
(Continued)

*Primary Examiner* — Kiet T Nguyen
(74) *Attorney, Agent, or Firm* — Miles & Stockbridge, P.C.

(57) ABSTRACT

The performance of a power supply module is to be improved. The occurrence of discharge in the power supply module is to be prevented, and the size of the power supply module is to be reduced. In a power supply module, substrates are provided being stacked in a planar view. A low voltage circuit and a high voltage circuit are formed on a first substrate such that a distance is kept for preventing surface discharge, and a low voltage circuit is formed on a second substrate. A distance between a component of a high voltage alternating current circuit on the high voltage circuit and a component of the low voltage circuit is three times a shortest distance, at which space discharge does not occurs, between a component that constitutes a high voltage direct current circuit on the high voltage circuit and a component that constitutes the low voltage circuit.

15 Claims, 14 Drawing Sheets

(58) Field of Classification Search
CPC .... H02M 3/33561; H02M 3/003; H02M 3/28;
H02M 1/009; H02M 1/44; H02M 7/003;
H05K 7/14339
USPC .......................................................... 250/281
See application file for complete search history.

(56) References Cited

U.S. PATENT DOCUMENTS

| | | | |
|---|---|---|---|
| 10,178,780 B2 * | 1/2019 | Nakatsu | ................ H05K 7/209 |
| 2005/0205970 A1 | 9/2005 | Chen et al. | |
| 2012/0275205 A1 | 11/2012 | Nakatsu et al. | |
| 2013/0003299 A1 | 1/2013 | Wissner et al. | |
| 2018/0116065 A1 | 4/2018 | Schuetz et al. | |
| 2018/0138810 A1 | 5/2018 | Hattori et al. | |
| 2019/0199224 A1 | 6/2019 | Yukawa et al. | |
| 2020/0194246 A1 | 6/2020 | Sheils et al. | |

FOREIGN PATENT DOCUMENTS

| | | |
|---|---|---|
| JP | 2004157463 A | 6/2004 |
| JP | 2011067093 A | 3/2011 |
| JP | 2016-144283 A | 8/2016 |
| JP | 2016208626 A | 12/2016 |
| JP | 2016220500 A | 12/2016 |
| KR | 10-2017-0072037 A | 6/2017 |
| WO | 2018103126 A1 | 6/2018 |
| WO | 2018218308 A1 | 12/2018 |

OTHER PUBLICATIONS

Written Opinion mailed Oct. 27, 2020 in International Application No. PCT/JP2020/033669.
Search Report mailed Oct. 11, 2023 in European Application No. 20877172.5.

* cited by examiner

FIG. 2

$$D = \frac{Vh - Vl}{3} \quad \cdots \quad (2)$$

POWER SUPPLY MODULE AND MASS SPECTROMETER

TECHNICAL FIELD

The present invention relates to a power supply module and a mass spectrometer, and more particularly to a high voltage module including a substrate having a high voltage direct current circuit and a high voltage alternating current circuit and another substrate in the inside of the high voltage module and a mass spectrometer using the high voltage module.

BACKGROUND ART

For example, as a device that supplies a high voltage to an ion source or a detector installed on a mass spectrometer, a power supply module is known.

In order to combine low costs with highly accuracy, Patent Literature 1 (Japanese Unexamined Patent Application Publication No. Hei7 (1995)-99777) describes that a secondary substrate formed with a boost rectifier circuit unit is disposed on a primary substrate, which is a high voltage power supply unit, to form a two-story structure.

CITATION LIST

Patent Literature

[Patent Literature 1] Japanese Unexamined Patent Application Publication No. Hei7 (1995)-99777

SUMMARY OF INVENTION

Technical Problem

Generally in the power supply module, the size of the power supply module increases in return for an increase in the output voltage and the improvement of electrical characteristics, such as a reduction in noise superposed on the module. On the other hand, a device (e.g., a mass spectrometer) on which the power supply module is installed is demanded to further increase in the voltage of the power supply module and reduce noise in order to achieve the high sensitivity of analysis, and at the same time, a reduction in the size of the device is also demanded in order to improve usability.

Other problems and novel features will be apparent from the description and the accompanying drawings of the present specification.

Solution to Problem

In embodiments disclosed in the present specification, a brief description of the summary of representative one is as follows.

In a power supply module according to a representative embodiment, a plurality of substrates is provided being overlapped with each other in the power supply module in a planar view. At this time, on a first substrate, a first low voltage circuit and a high voltage circuit are formed with a surface discharge prevention distance kept for preventing surface discharge, and on a second substrate, a second low voltage circuit is formed. Moreover, a distance between a component constituting a high voltage alternating current circuit formed on the high voltage circuit and a component constituting the second low voltage circuit is three times a shortest distance at which no space discharge occurs between the component constituting the high voltage direct current circuit formed on the high voltage circuit and the component constituting the second low voltage circuit.

Advantageous Effects of Invention

According to the representative embodiment, it is possible to improve the performance of the power supply module. More particularly, it is possible to prevent discharge from occurring in the power supply module and to reduce the size of the power supply module.

BRIEF DESCRIPTION OF THE DRAWINGS

FIG. 2 is an equation showing a space discharge prevention distance;

DESCRIPTION OF EMBODIMENTS

In the following, embodiments of the present invention will be described in detail with reference to the drawings. Moreover, in the entire drawings for explaining the embodiments, members having the same functions are designated with the same reference signs, and the redundant description is omitted. Furthermore, in the embodiments, the description of the same or similar parts is not repeated in principle, unless otherwise specifically necessary.

First Embodiment

In the following, there will be described a power supply module (high voltage power supply module) that outputs a high voltage and that has a plurality of substrates in its inside, the plurality of substrates being overlapped apart from each other. The present embodiment distinguishes a distance between a high voltage direct current circuit formed on a first substrate in the power supply module and a second substrate and a distance between a high voltage alternating current circuit formed on the first substrate in the power supply module and the second substrate. This achieves the prevention of discharge, a noise reduction, and a reduction in the size of the power supply module. In the present specification, elements and wires (printed wires) constituting a circuit are sometimes referred to as components constituting the circuit.

<Structure of Power Supply Module of Present Embodiment>

Figure 1:
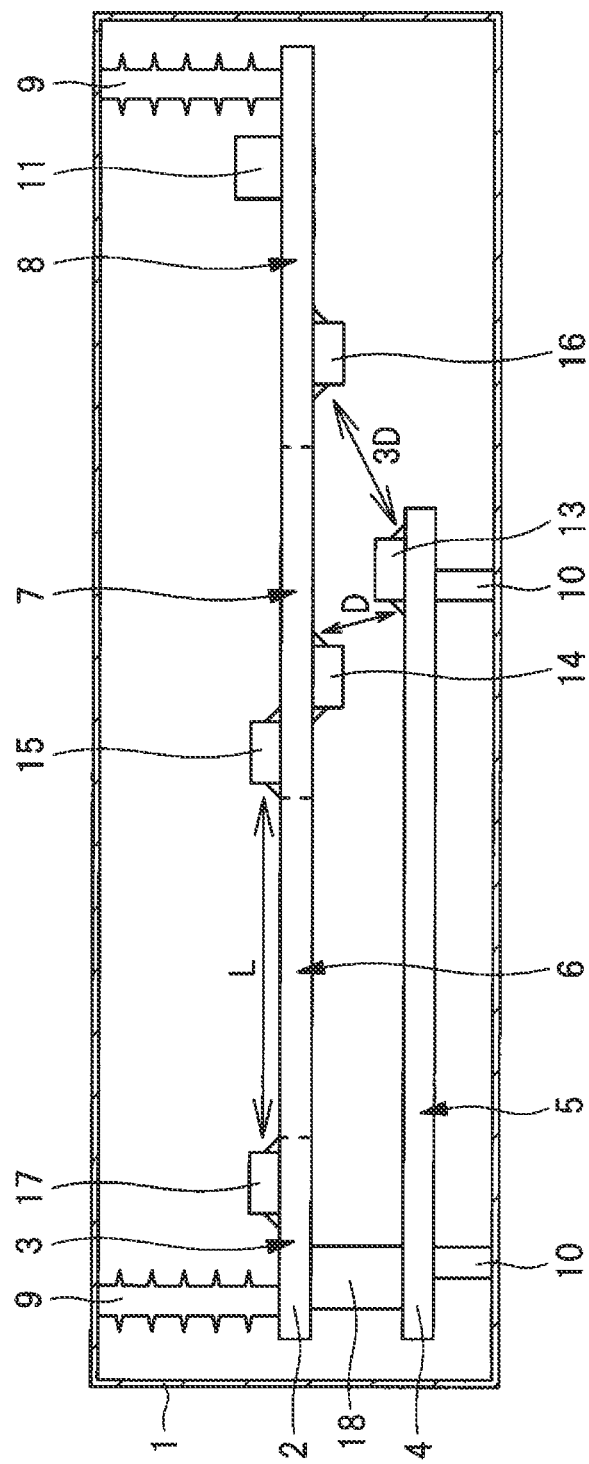
FIG. 1 is a partially broken side view showing a power supply module that is a first embodiment of the present invention.

FIG. 1 shows a side view in which the power supply module of the first embodiment is partially broken. The power supply module has a metal case 1 electrically connected to a ground, and a first substrate 2 and a second substrate 4 accommodated (disposed) in the metal case 1. That is, the metal case 1 is electrically grounded for the purpose of preventing the occurrence of an electric shock and external noise, for example. The shape of the metal case 1 is a rectangular parallelepiped, for example, that can be manufactured at low costs.

The first substrate 2 and the second substrate 4 each have as a part of their surfaces, a primary surface and a back surface on the opposite side of the primary surface. The first substrate 2 and the second substrate 4 are so-called printed wiring boards on which printed wires are provided on one or both of the primary surface and the back surface of the substrate formed of an insulator. Moreover, depending on design, wires are sometimes disposed on the inner layers of the first substrate 2 and the second substrate 4. Furthermore, on one or both of the primary surface and the back surface of the first substrate 2 and the second substrate 4, elements, such as a semiconductor element (e.g., a transistor), a capacitive element, or a resistor element are mounted. That is, in the first substrate 2 and the second substrate 4, one of the primary surface or the back surface, or both of the primary surface and the back surface are mounting surfaces.

The first substrate 2 and the second substrate 4 are disposed in parallel with each other at a position at which the first substrate 2 and the second substrate 4 are overlapped in a planar view. In other words, the primary surface and the back surface of the first substrate 2 and the primary surface and the back surface of the second substrate 4 are in parallel with each other. The primary surface or the back surface of the first substrate 2 and the primary surface or the back surface of the second substrate 4 are opposite to each other. In the direction perpendicular to the primary surface of the first substrate 2 (the height direction, the substrate stacking direction, and the vertical direction), the first substrate 2 and the second substrate 4 are disposed at positions at different heights. The first substrate 2 and the second substrate 4 are disposed in parallel with each other, and thus it is possible to easily manufacture the power supply module, it is possible to easily design the distance between the substrates, and it is also possible to easily transmit signals and the like between the substrates.

The first substrate 2 has a high voltage region and a low voltage region. In the high voltage region of the first substrate 2, a high voltage power supply circuit is formed, and the high voltage power supply circuit includes a high voltage direct current circuit 7 and a high voltage alternating current circuit 8. In the low voltage region of the first substrate 2, a low voltage circuit 3 is formed. The second substrate 4 has a low voltage region, and in the low voltage region, a low voltage circuit 5 is formed. The high voltage power supply circuit operates at a voltage higher than that of the low voltage circuits 3 and 5. In other words, the high voltage direct current circuit 7 and the high voltage alternating current circuit 8 operate at a voltage higher than that of the low voltage circuits 3 and 5. In FIG. 1, in order to split the first substrate 2 into four regions, a broken line is depicted at three places on the side surface of the first substrate 2.

The high voltage circuit operates at a voltage of 300 V or more or 1,000 V or more, for example, and the low voltage circuits 3 and 5 operate at a voltage less than 300 V. In the present embodiment, a circuit in which the voltage of an electrical signal carried through the circuit has an amplitude of 300 V or more is referred to as a high voltage alternating current circuit. Moreover, a circuit in which the amplitude of the voltage of an electrical signal carried through the circuit is less than 300 V and the maximum absolute value of the voltage is 300 V or more is referred to as a high voltage direct current circuit. Furthermore, a circuit in which the amplitude of the voltage of the electrical signal carried through the circuit is less than 300 V and the maximum absolute value of the voltage is less than 300 V is referred to as a low voltage circuit.

The first substrate 2 is electrically connected to the second substrate 4 using a substrate-to-substrate connecting unit (transmission part) 18, for example. The substrate-to-substrate connecting unit 18 is the transmission part used for transmitting signals and electric power between the first substrate 2 and the second substrate 4. More specifically, it is considered that electric power is transmitted using a cable having a connector at its end part and the signal is transmitted via optical communication using a photocoupler. In addition to these, as the substrate-to-substrate connecting unit 18, any one of the cable or the connector may be used. Moreover, a transformer may be used as the substrate-to-substrate connecting unit 18 to perform magnetic transmission.

Next, the distances between the circuits described above will be described. between the high voltage circuit disposed on the first substrate 2 and the low voltage circuits 3 and 5, a high potential difference occurs. As a result, it is necessary to separate the high voltage circuit from the low voltage circuits 3 and 5 at a distance or more at which no discharge occurs. For example, an element (component) 15 constituting the high voltage circuit of the first substrate 2 and an element (component) 17 constituting the low voltage circuit 3 are disposed at a distance L or more at which no surface discharge occurs. In other words, the shortest distance from the low voltage region of the first substrate 2 to the high voltage region of the first substrate 2 is the distance L.

The distance L is a distance in a direction along the mounting surface of the first substrate 2, and defines the minimum value of the shortest distance between the component constituting the high voltage circuit and the component constituting the low voltage circuit 3. That is, the distance L is a minimum distance that has to be reserved so as not to cause surface discharge, and can be referred to as a surface discharge prevention distance. The surface discharge referred here is discharge that occurs along the surface of the substrate.

The component referred here is a structure constituting the circuit, such as elements and wires (printed wires) constituting the high voltage circuit or the low voltage circuit 3. The element as the component constituting the circuit includes not only a conductor portion, such as the terminal of a semiconductor element but also an insulator portion, such as a resin constituting a part of the semiconductor element, for example. This similarly applies to the component constituting the low voltage circuit 5. The element 15 shown as an example in FIG. 1 is a component located nearest to the low voltage circuit 3 in the components constituting the high voltage circuit, and the element 17 is a component located nearest to the high voltage circuit in the components constituting the low voltage circuit 3.

As shown in FIG. 1, in order to reserve the distance L, it is necessary to provide a region 6 in which no component is mounted. The region 6 of the first substrate 2 is a region that is located between the low voltage circuit 3 and the high voltage circuit and has no conductor part including printed wires and the like. However, on the surface of the first substrate 2 in the region 6, a transmission component (e.g., an optical fiber and the like) that transmits signals or electric power between the low voltage circuit 3 and the high voltage circuit and that is formed of an insulator may be mounted. For example, as the transmission component, a photocoupler, a transformer, or the like can be used.

Moreover, an element 14 that is a component constituting the high voltage circuit of the first substrate 2 and an element 13 that is a component constituting the low voltage circuit 5 are disposed at distance D or more at which no space discharge occurs. That is, the distance D is a minimum distance that has to be reserved so as not to cause space discharge, and can be referred to as a space discharge prevention distance. The elements 13 and 14 are respectively provided on the mounting surface of the second substrate 4 and the mounting surface of the first substrate 2 opposite to each other. The element 14 shown as an example in FIG. 1 is a component located nearest to the low voltage circuit in the components constituting the high voltage circuit, and the element 13 is a component located nearest to the high voltage circuit in the components constituting the low voltage circuit 5.

A calculation formula expressing the relationship of the distance L, the distance D, and a potential difference are expressed, for example, by Equation (1) below and Equation (2) shown in FIG. 2. Here, the high voltage used for the operation of the high voltage circuit included in the first substrate 2 is denoted as Vh, and the low voltage used for the operation of the low voltage circuits 3 and 4 is denoted as Vl. The unit of these voltages is kV. Moreover, the units of the distances L and D are mm.

$$L = 0.16(Vh-Vl)2 + 0.5(Vh-Vl) - 0.07 \quad (1)$$

Figure 3:
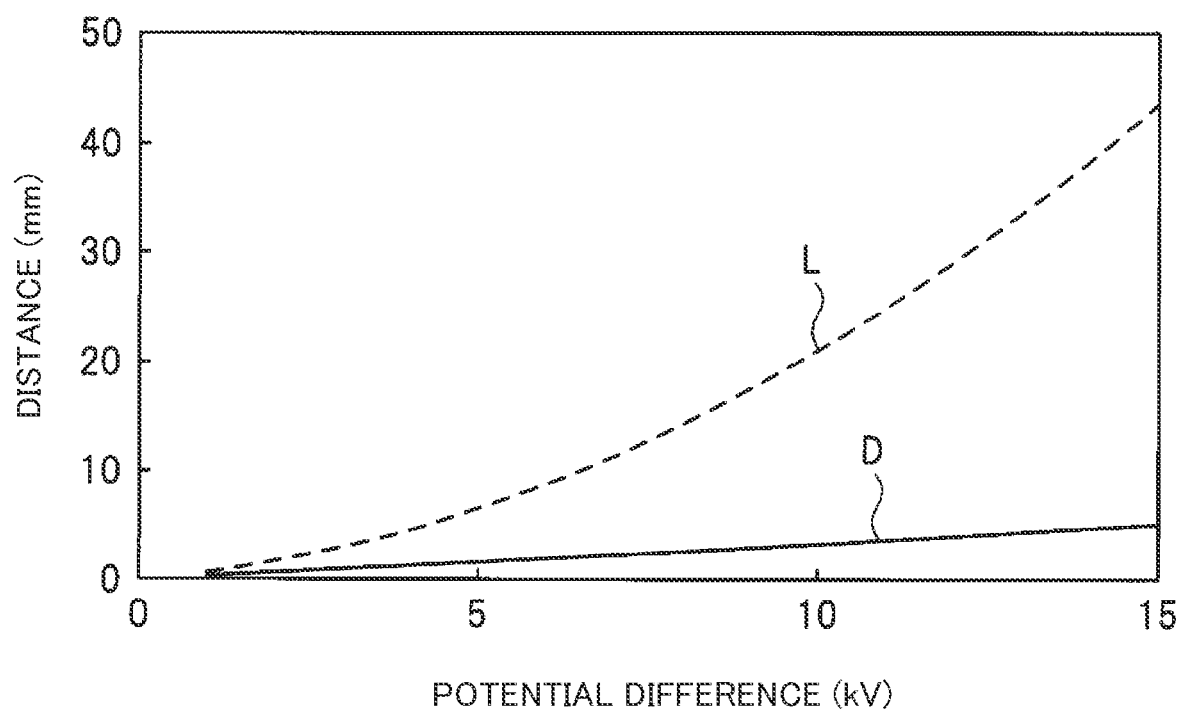
FIG. 3 is a graph showing the properties of a surface discharge prevention distance and a space discharge prevention distance to a potential difference.

FIG. 3 shows a graph in which the distances L and D are calculated using Equation (1) and Equation (2). The horizontal axis of the graph expresses a potential difference (high voltage (kV) –low voltage (kV)), and the vertical axis expresses a distance (mm) at which discharge is preventable. In the graph, the distance L is expressed by a broken line, and the distance D is expressed by a solid line. From FIG. 3, it is shown that in the case in which the potential differences are similar, the distance L has to be a distance more than the distance D. That is, compared with the case in which only a gas (air) is present between the components, discharge is prone to occur in the case in which a gas and a solid (a substrate) are present between the components.

Therefore, from the viewpoint of preventing discharge, in the case in which a high voltage circuit and a low voltage circuit are formed on the same substrate, it is necessary to keep the distance L between these circuits. In regard to this, in the case in which a high voltage circuit and a low voltage circuit are formed on both different substrates, the distance D that is shorter than the distance L only has to be kept for the distance between these circuits. Accordingly, in the power supply module, the distance between the circuits can be shortened in forming a high voltage circuit and a low voltage circuit on both different substrates than in forming a high voltage circuit and a low voltage circuit only on the same substrate, and thus it is possible to reduce the size of the power supply module.

Next, distances between the high voltage direct current circuit 7, the high voltage alternating current circuit 8, and the other low voltage circuits will be described focusing attention on the high voltage circuit region of the first substrate 2 that has the high voltage direct current circuit 7 and the high voltage alternating current circuit 8. The high voltage region circuit of the first substrate 2 has a direct current region and an alternating current region, in which the high voltage direct current circuit 7 is formed in the direct current region and the high voltage alternating current circuit 8 is formed in the alternating current region.

Here, the element 14 that is a component constituting the high voltage direct current circuit 7 of the first substrate 2, the element 13 that is a component constituting the low voltage circuit 3 of the second substrate 4, and the metal case 1 are disposed apart at distances or more at which no discharge occurs at a high voltage direct current. Moreover, an element 16 that is a component constituting the high voltage alternating current circuit 8 of the first substrate 2, the element 13 that is a component constituting the low voltage circuit 3 of the second substrate 4, and the metal case 1 are disposed apart at distances at which no discharge occurs at an alternating high voltage.

More specifically, the element 14, the element 13, and the metal case 1 are disposed apart at the distance D or more from each other. Here, compared with the high voltage direct current circuit 7, the high voltage alternating current circuit 8 is prone to cause discharge to the other low voltage circuits. As a result, the distance (space discharge prevention distance) at which no discharge occurs at an alternating high voltage is three times the distance D (a distance 3D). In other words, the element 16 and the metal case 1 are disposed apart at a distance three times the distance D or more from each other, and the element 16 and the element 13 are disposed apart at a distance three times the distance D or more from each other. However, since the voltages of the element 13 and the metal case 1 are low voltages from each other, the distance between the element 13 and the metal case 1 may be less than the distance D. The distance L is three times longer than the distance D. As described above, the distance from the metal case 1 to the component constituting the high voltage alternating current circuit 8 is kept at a distance three times the distance D or more, and thus it is possible to prevent the occurrence of discharge between the metal case 1 and the high voltage alternating current circuit 8.

The first substrate 2 is fixed to the metal case 1 with a high voltage insulating spacer 9, and the second substrate 4 is fixed to the metal case 1 with a low voltage insulating spacer 10. Moreover, the high voltage alternating current circuit 8 of the first substrate 2 is disposed near an output terminal 11 of the power supply module, and the high voltage alternating current circuit 8 and the low voltage circuit 3 are disposed apart at a longest distance among a plurality of circuits disposed on the first substrate 2. Since the first substrate 2 is fixed to the metal case 1 with the high voltage insulating spacer 9, it is possible to prevent the occurrence of discharge between the circuit formed on the first substrate 2 and the metal case 1 through the spacer.

In the present embodiment, no constituent component of the other circuit is disposed right below and right above the high voltage alternating current circuit 8. In other words, a region that is overlapped with the high voltage alternating current circuit 8 in a planar view and the low voltage circuit 5 formed on the second substrate 4 are apart from each other in a planar view. In addition, here, in a planar view, the high voltage alternating current circuit 8 and the second substrate 4 are apart from each other. Consequently, the shortest distance from the component constituting the high voltage alternating current circuit 8 to the component constituting the low voltage circuit 5 is always a distance in an oblique direction to the mounting surfaces of the substrates. Accordingly, the oblique distance only has to be a size three times the distance D or more, and it is unnecessary to reserve a distance three times the distance D or more for the distance between the substrates in the height direction.

As a result, for example, in the case in which the first substrate 2 is apart from the metal case 1 at a distance three times the distance D in the height direction, it is possible to dispose the second substrate 4 between the first substrate 2 and the metal case 1 with no increase in the distance between the first substrate 2 and the metal case 1. Accordingly, when a substrate, which needs a large area for disposing a plurality of types of circuits, is split and overlapped, it is possible to prevent the size of the power supply module from increasing.

<Effects of Present Embodiment>

Figure 14:
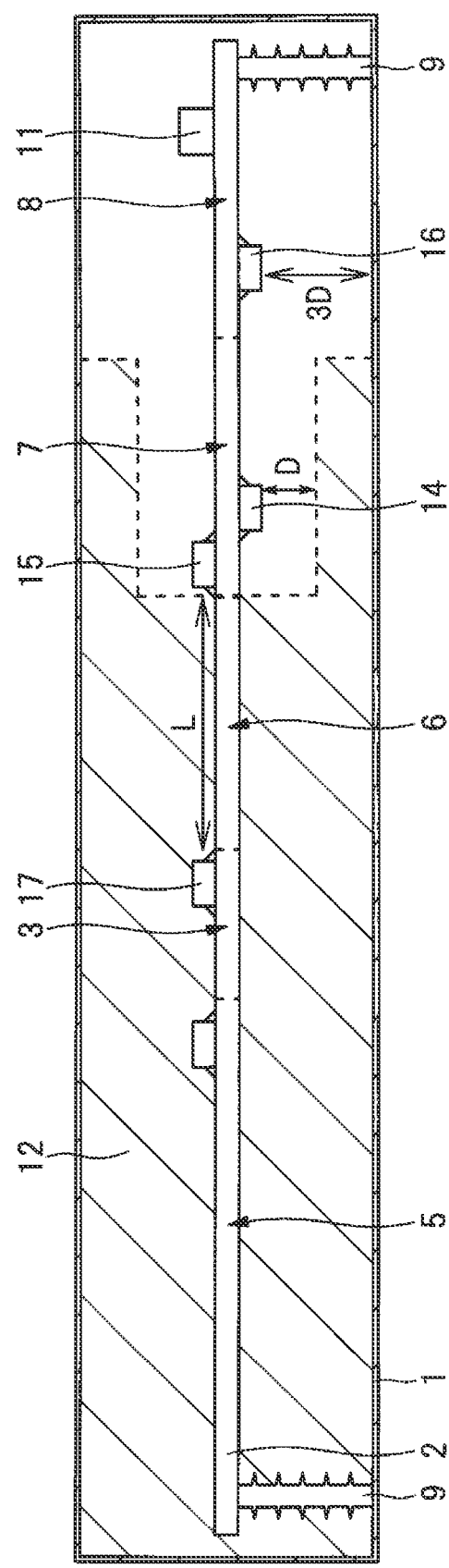
FIG. 14 is a partially broken side view showing a power supply module that is a comparative example.

FIG. 14 shows a side view in which a power supply module of a comparative example is partially broken. The structure of the power supply module of the comparative example is different from the structure shown in FIG. 1 in that only a first substrate 2 is provided with no overlapped substrate and a low voltage circuit 5 is formed on the first substrate 2 adjacent to a low voltage circuit 3.

First, problems of design in small-sized power supply modules will be describe. In regard to a distance between a region in which a high voltage is applied and a low voltage region in which a ground and the like are formed in a power supply module, an appropriate surface discharge prevention distance has to be reserved so as not to cause no discharge. This surface discharge prevention distance increases lining to the potential difference between the high voltage region and the low voltage region. As a result, the surface discharge prevention distance increases as the voltage becomes increases, causing an increase in the size of the power supply module correspondingly. In addition, in the case in which an electrically alternating current component is present in the high voltage region inside the power supply module, it is necessary to dispose the high voltage region and the low voltage region at positions sufficiently apart from each other such that electromagnetic radiation (electromagnetic waves) caused due to its alternating current component is not superposed on the wire of a control circuit that is disposed in the low voltage region, which easily increases in the size of the power supply module. In other words, it is difficult to combine the prevention of discharge in the high voltage region and the low voltage region and the prevention of superposition of electromagnetic waves with design of small-sized power supply modules.

In the comparative example, from the viewpoint of preventing space discharge, it is necessary to separate a metal case 1 from an element 16 constituting a high voltage alternating current circuit 8 at a distance three times the distance D or more. As a result, in the case of using the metal case 1 in a rectangular parallelepiped that is manufacturable at low costs, useless spaces are produced in spaces upper and lower a region 6 for reserving the low voltage circuits 3 and 5 and a surface square circular prevention distance (a space 12 shown with hatchings in FIG. 14).

In regard to this, in the present embodiment, the second substrate 4 is disposed in the space 12 to efficiently use the space in the metal case 1, and thus it is possible to reduce the size of the power supply module. Here, the low voltage circuit 5 shown in FIG. 14 is formed on the second substrate 4 as shown in FIG. 1, and disposed below the first substrate 2. Accordingly, the width of the power supply module in the direction (the lateral direction) along the mounting surfaces of the substrates is reduced, and it is possible to reduce the size of the power supply module.

Moreover, in the present embodiment, as shown in FIG. 1, in consideration of the presence of the high voltage alternating current circuit 8, the component constituting the low voltage circuit 5 formed on the second substrate 4 is disposed at a position at which the low voltage circuit 5 is not overlapped with the high voltage alternating current circuit 8 in a planar view. Since the component constituting the low voltage circuit 5 is disposed at a position apart from the component constituting the high voltage alternating current circuit 8 at a distance three times the distance D or more, it is possible to prevent discharge from occurring, and it is possible to provide the distance from the component mounted on the component and the first substrate 2 in the height direction as a distance less than three times the distance D. Therefore, the substrate in the power supply module is allowed to be overlapped while preventing the size of the power supply module in the height direction from increasing, and thus it is possible to reduce the size of the power supply module.

That is, in the present embodiment, the multi-layer structure of the printed wiring board is achieved while preventing discharge, and thus it is possible to provide a small-sized, high-performance power supply module.

In the power supply module of the present embodiment, an insulator, such as a resin that prevent discharge is not packed in the inside of the metal case 1. In the case in which such a resin is packed so as to cover the surface of the first substrate 2 or the second substrate 4, a parasitic component (a parasitic element, such as a parasitic capacitance) due to the resin is produced. As a result, the strength of electromagnetic radiation that is superposed from the high voltage circuit to the low voltage circuit increases, and noise is prone to affect the plurality of circuits.

In regard to this, in the present embodiment, any of the first substrate 2 and the second substrate 4 are not covered in the metal case 1. In other words, no resin is packed between the metal case 1 and the first substrate 2 or the second substrate 4, and between the first substrate 2 and the second substrate 4. Therefore, it is possible to prevent the occurrence of a parasitic component due to the presence of a resin and the occurrence of influence due to noise. Accordingly, it is possible to improve the performance of the power supply module.

<First Exemplary Modification>

In the following, as a first exemplary modification of the first embodiment, a structure that reduce noise electromagnetically radiated from a high voltage alternating current circuit will be described.

<Detail of Room for Improvement>

Figure 4:
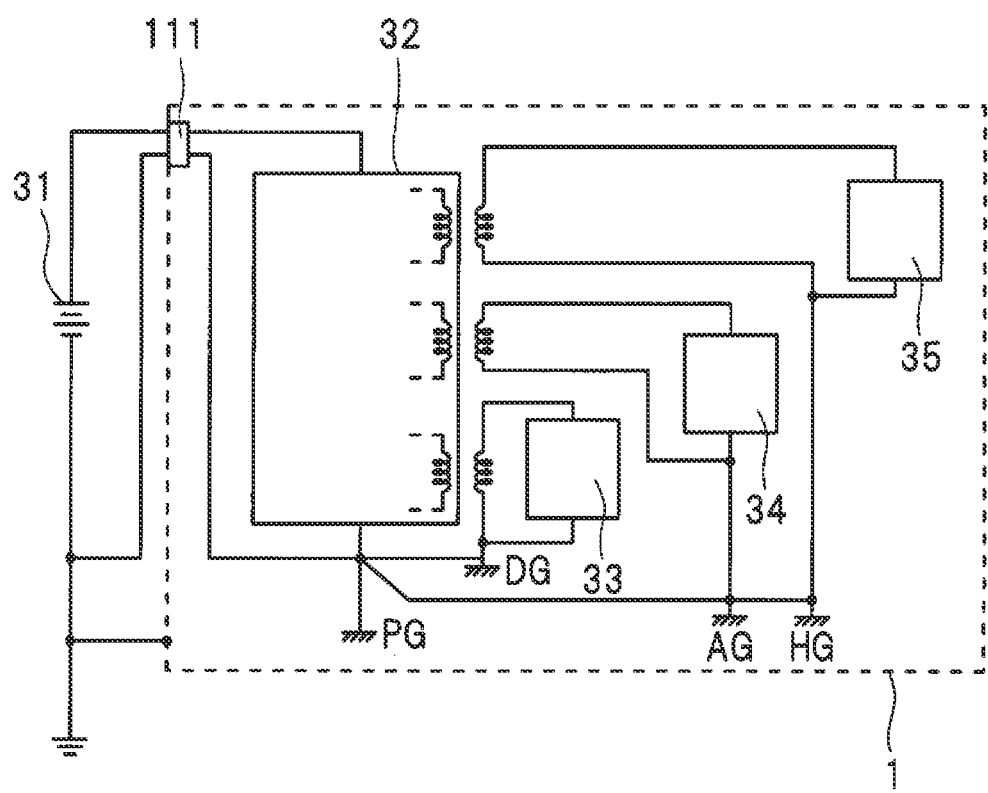
FIG. 4 is a circuit diagram showing the ground connection structure of a power supply module according to a comparative example.

FIG. 4 shows a circuit diagram showing the ground connection wire structure of a power supply module that is a comparative example. In the ground wire diagram in FIG. 4, a power supply 31, a digital circuit 33, an analog circuit 34, and a high voltage circuit 35 of the power supply module are included, and a power circuit (voltage transformation circuit) 32 that generates power supply voltages for these circuits is included. In other words, the power supply module has the high voltage circuit 35 that outputs a high voltage, the digital circuit 33 that controls the high voltage circuit 35, and the analog circuit 34. The operation reference potential of the power circuit 32 is a ground PG. In other words, the power circuit 32 is electrically connected to the ground PG. The digital circuit 33 is electrically connected to a ground DG. The analog circuit 34 is electrically connected to a ground AG. The high voltage circuit 35 is electrically connected to a ground HG.

The power supply 31 is an external power supply of the power supply module, and grounded. A metal case 1 that accommodates the circuits in the power supply module is expressed by a broken line in FIG. 4. The power supply module is connected to the external power supply 31 of the power supply module through a cable, and the cable is drawn from terminal (connector) 111 to the outside of the metal case 1. The grounds PG, DG, AG, and HG are a ground in the circuit provided in the power supply module. As shown in FIG. 4, the grounds PG and DG are electrically connected to each other. Moreover, the grounds PG and DG and the ground AG are electrically connected to each other. The ground HG is electrically connected to the grounds PG and DG through the ground AG. Furthermore, the power circuit 32 is electrically connected to the power supply 31 through the terminal 111 and the cable, and the ground PG is electrically connected to the power supply 31 through the terminal 111 and the cable.

The power circuit 32, the digital circuit 33, and the analog circuit 34 are included in a circuit (e.g., a low voltage circuit 3 or 4) other than the high voltage direct current circuit 7 and the high voltage alternating current circuit 8 in the structure shown in FIG. 1. The high voltage circuit 35 is included in the high voltage direct current circuit 7 or the high voltage alternating current circuit 8 in the structure shown in FIG. 1.

When the digital circuit 33 and the analog circuit 34 installed on the second substrate 4, for example, are disposed close to the high voltage alternating current circuit 8 that is a source of noise by applying the size reduction method described with reference to FIG. 1 to the power supply module of the present embodiment (see FIG. 1), the digital circuit 33 and the analog circuit 34 are prone to be affected by noise. Next, a method that is capable of achieving a reduction in the size of the power supply module while suppressing the noise electric current of the low voltage circuit will be described below.

Figure 5:
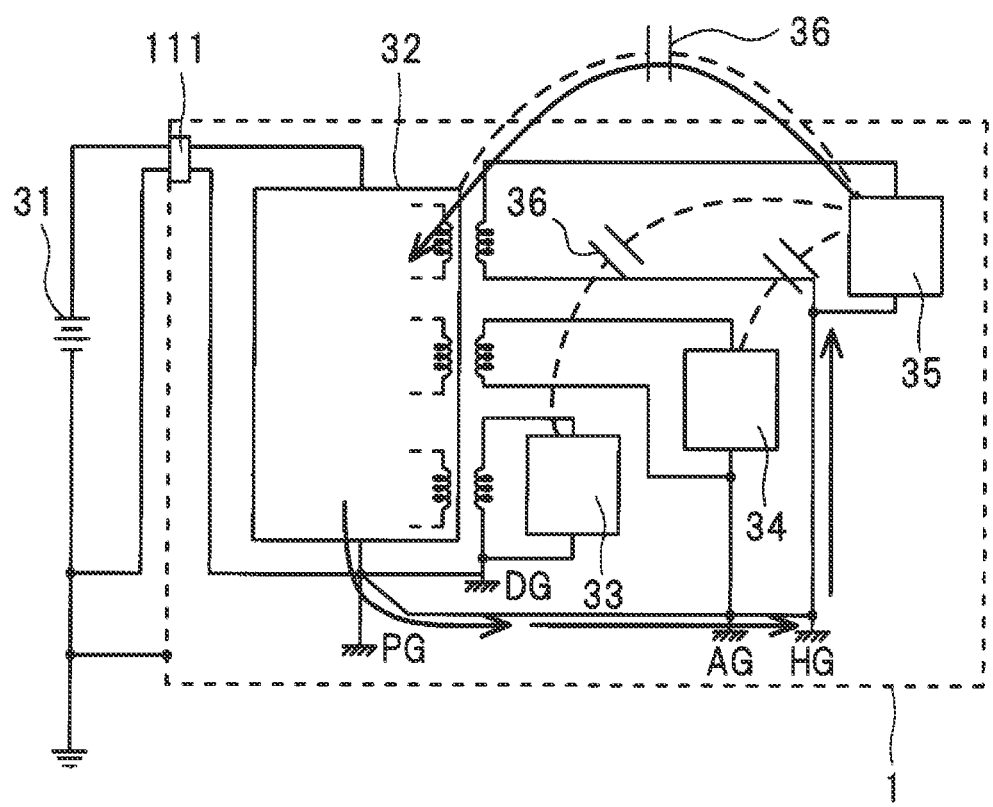
FIG. 5 is a circuit diagram showing the noise route of a power supply module according to a comparative example.
Figure 6:
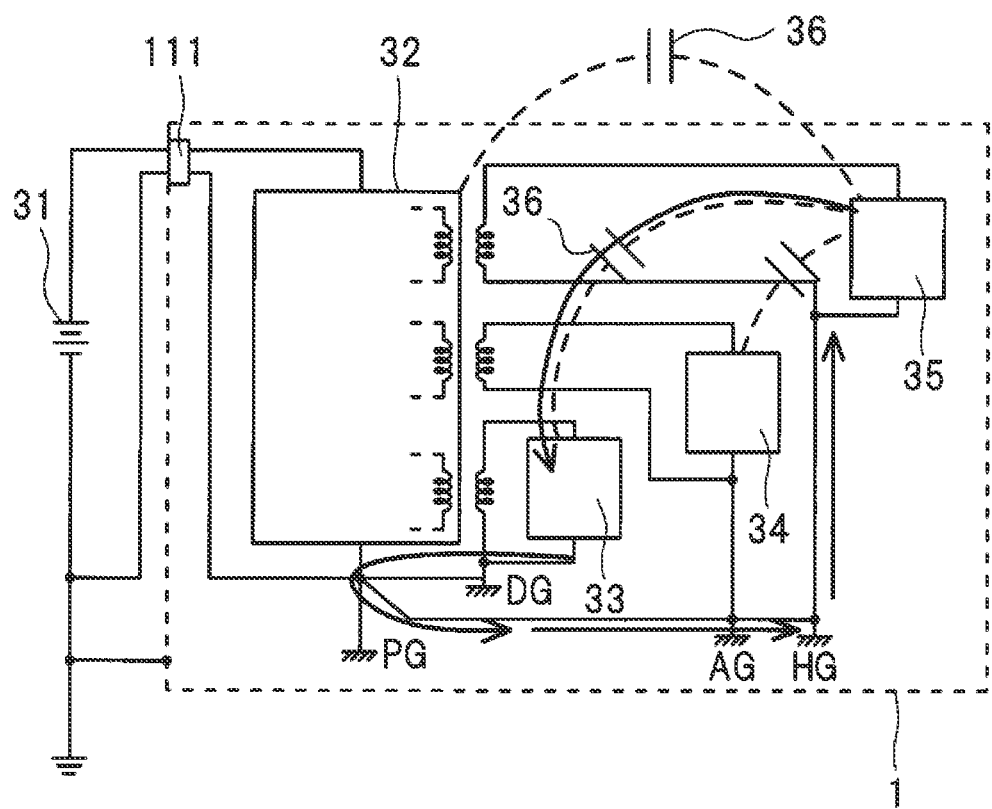
FIG. 6 is a circuit diagram showing the noise route of a power supply module according to a comparative example.
Figure 7:
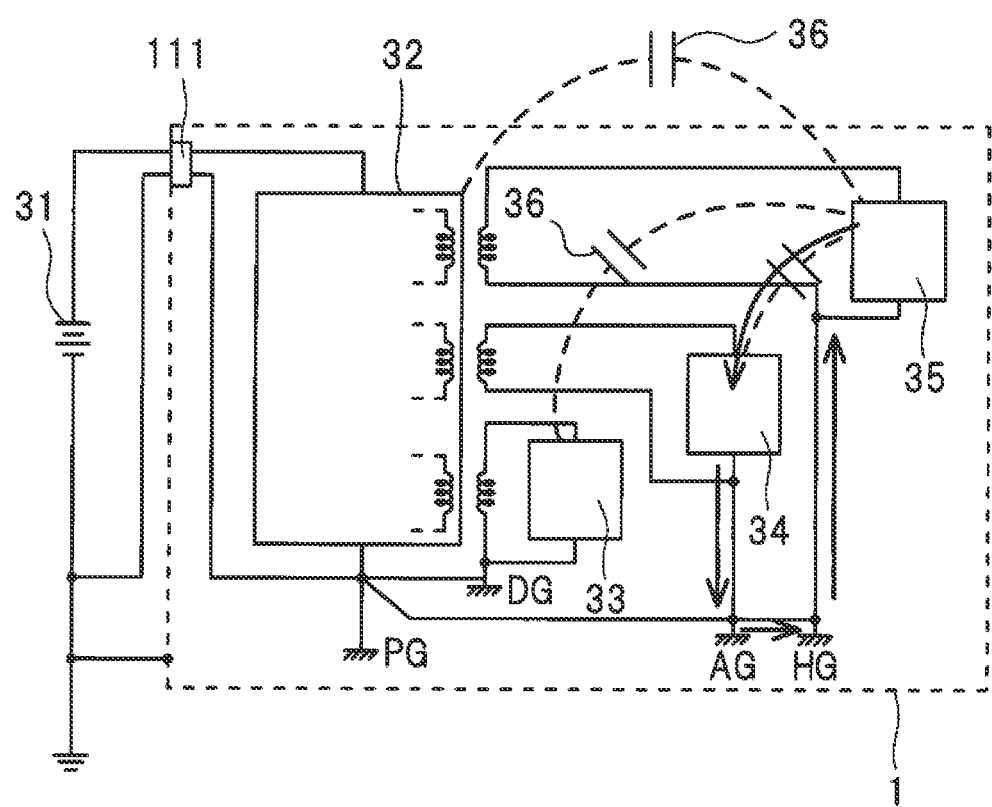
FIG. 7 is a circuit diagram showing the noise route of a power supply module according to a comparative example.

FIG. 5 shows paths through which the noise electric current passes the power circuit 32, FIG. 6 shows paths through which the noise electric current passes the digital circuit 33, and FIG. 7 shows paths through which the noise electric current passes the analog circuit 34. The circuits shown in FIG. 5 to FIG. 7 are the same as the circuits shown in FIG. 4. In FIG. 5 to FIG. 7, the path through which the noise electric current is carried is expressed by thick arrows. In FIG. 5 to FIG. 7, a capacitor 36 that is a parasitic capacitance is shown.

The noise electric current is carried tracing a loop-shaped path through which the noise electric current is output from a noise emission source and again returns to the noise emission source. In the limitation of electromagnetic radiation due to a high voltage alternating current, the electromagnetic radiation can be simply considered to be the capacitor 36 that is produced by electric field coupling. In FIG. 5, the noise electric current is output from the high voltage circuit 35, passes the capacitor 36 and the power circuit 32, and then returns to the high voltage circuit 35 through the grounds PG, AG, and HG. As a result, when the path of the noise electric current as shown in FIG. 5 is blocked, the noise electric current is not carried to the power circuit 32, and it is possible to reduce noise conducting from the high voltage circuit 35 the other circuits. Similarly, in consideration of noise paths shown in FIG. 6 and FIG. 7, all the noise electric currents always in turn pass the grounds AG and HG.

<Structure and Effect of Present Exemplary Modification>

Figure 8:
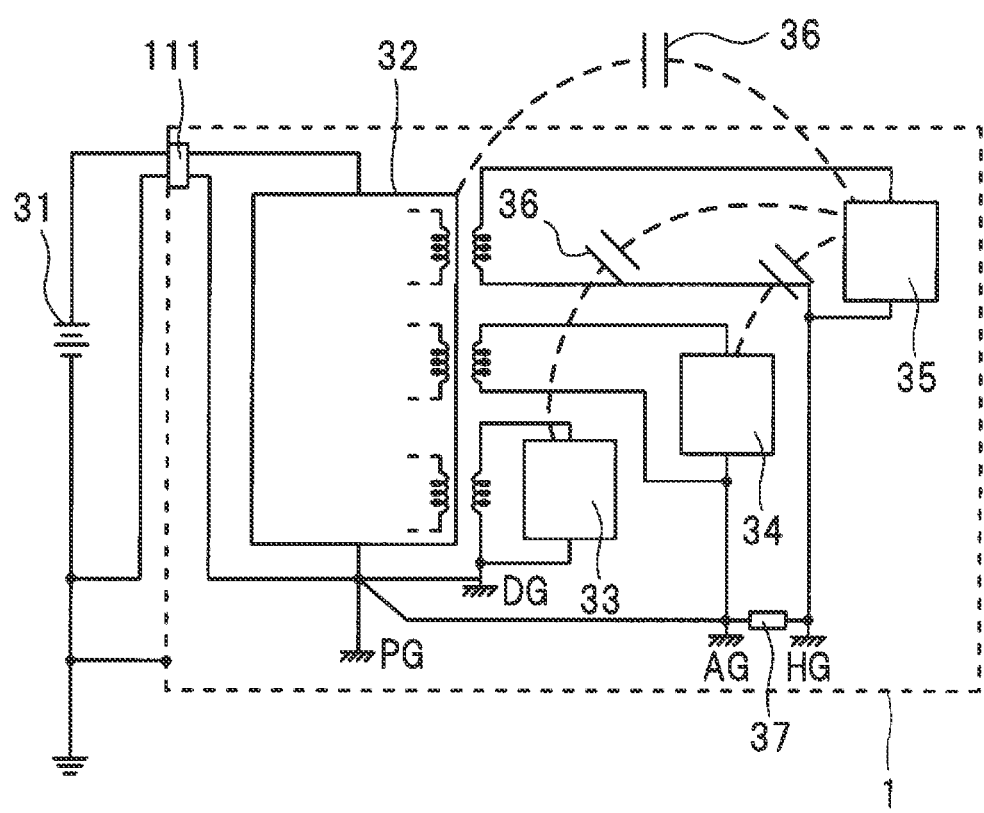
FIG. 8 is a circuit diagram showing a power supply module that is a first exemplary modification of the first embodiment of the present invention.

Since all the noise electric currents always in turn pass the grounds AG and HG, in the present exemplary modification, as shown in FIG. 8, an electric noise reduction filter 37 is disposed between the grounds AG and HG, and thus it is possible to block the noise electric current path.

The configuration of the circuits shown in FIG. 8 is the same as configuration of the circuits shown in FIG. 4 except that the electric noise reduction filter 37 lies between the grounds AG and HG. In other words, the grounds AG and HG are electrically connected to each other through the electric noise reduction filter 37. That is, the ground HG is electrically connected to the ground AG and the grounds PG and DG through the electric noise reduction filter 37 (a noise reduction component 19 below). In other words, the ground AG is electrically connected to the electric noise reduction filter 37, and the electric noise reduction filter 37 is electrically connected to the ground HG.

Figure 9:
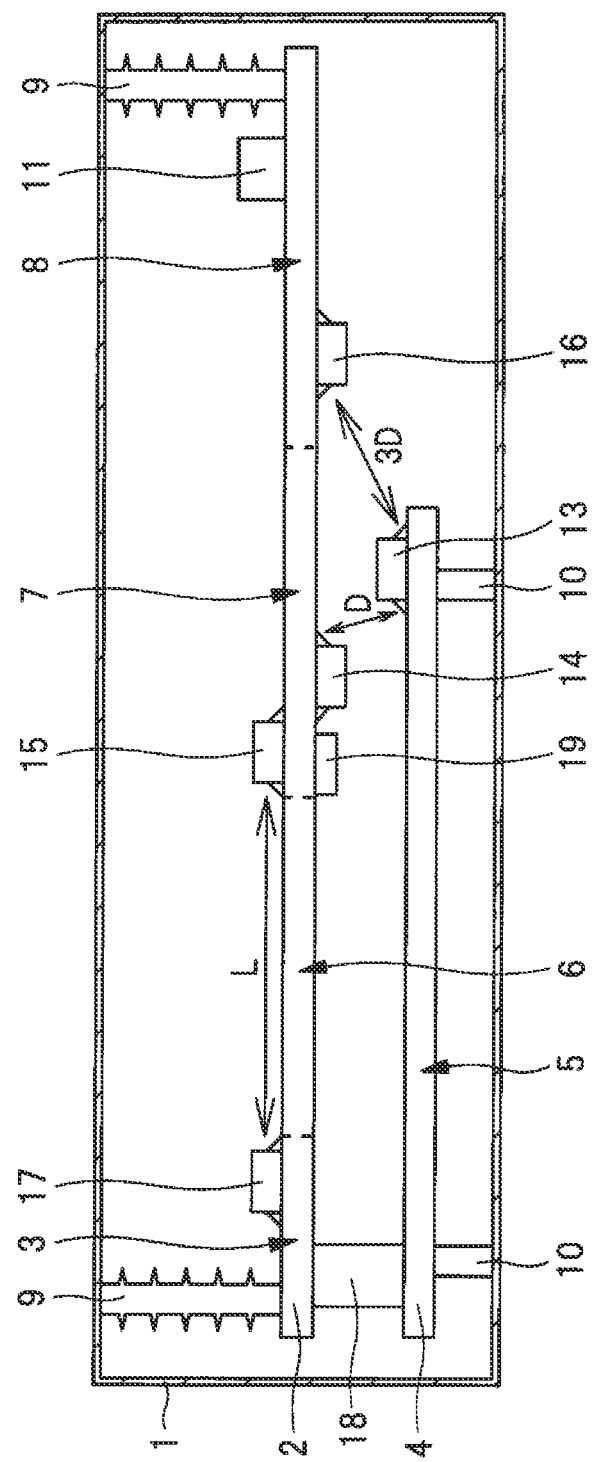
FIG. 9 is a partially broken side view showing the power supply module that is the first exemplary modification of the first embodiment of the present invention.

As examples of the electric noise reduction filter 37, a ferrite bead, resistor element, capacitive element, or the like can be used. FIG. 9 shows a side view in which the power supply module of the present exemplary modification is partially broken. The electric noise reduction filter 37 corresponds to the noise reduction component 19 shown in FIG. 9, for example. The noise reduction component 19 is mounted on a place adjacent to a region 6 in the high voltage region of a first substrate. Here, the noise reduction component 19 is formed in a region in which the high voltage direct current circuit 7 is formed.

As described above, it is possible to reduce the noise electric current sue to the electromagnetic radiation of the high voltage alternating current circuit.

Therefore, even though the multi-layer configuration of the printed wiring board, which can closely dispose the low voltage circuit to the high voltage circuit, is adopted to the power supply module, it made possible to prevent discharge and to suppress the noise electric current due to electromagnetic radiation, and it is possible to achieve a small-sized, high-performance power supply module.

<Second Exemplary Modification>

In the following, as a second exemplary modification of the present embodiment, an embodiment will be described in the case in which the area of a low voltage circuit is considerably larger than the area of a high voltage circuit and the low voltage circuit fails to be mounted on one second substrate 4 shown in FIG. 1.

Figure 10:
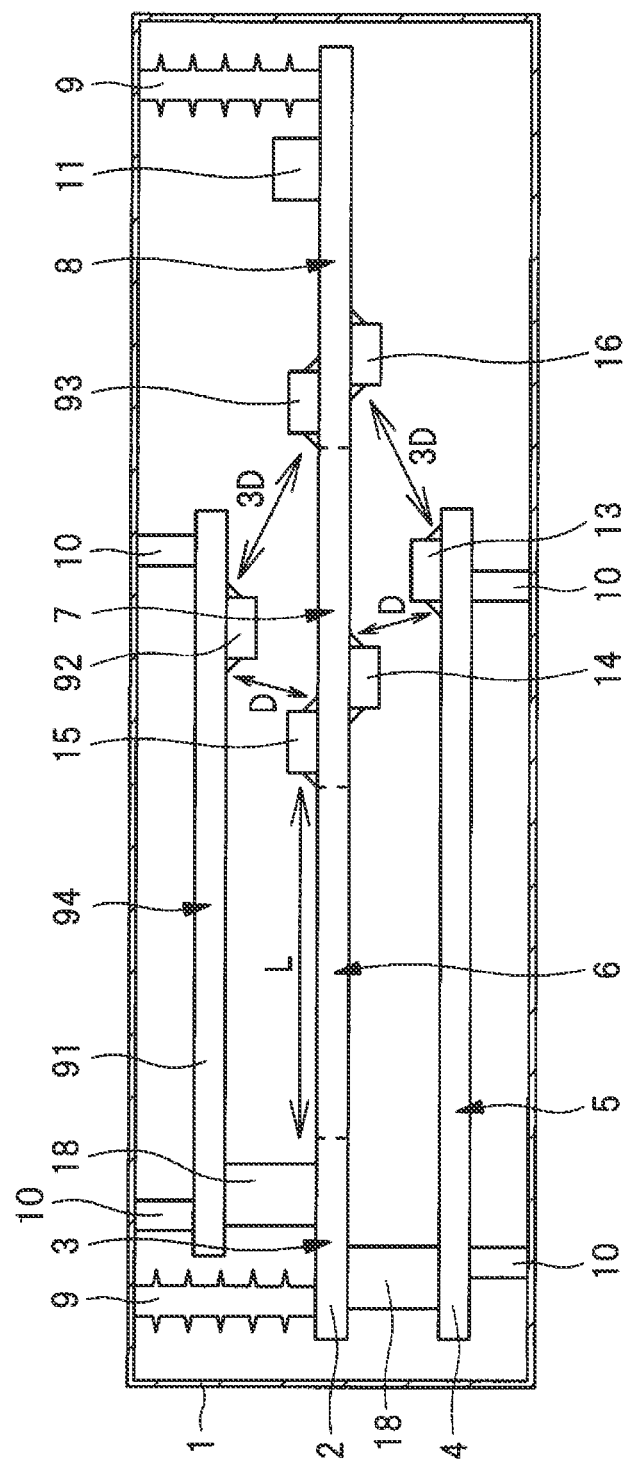
FIG. 10 is a partially broken side view showing a power supply module that is a second exemplary modification of the first embodiment of the present invention.

FIG. 10 shows a side view in which a power supply module of the present exemplary modification is partially broken. In the low voltage circuit, a circuit that is not accommodated in the second substrate 4 is formed in a low voltage region of a third substrate 91 disposed on a first substrate 2 as shown in FIG. 10. The third substrate 91 is formed at a position at which the third substrate 91 is overlapped with the first substrate 2 in a planar view. However, a component constituting a low voltage circuit 94 formed on the third substrate 91 is apart from an alternating current region formed on a high voltage alternating current circuit 8 in a planar view.

Here, the third substrate 91 extended to the structure shown in FIG. 1 is accommodated in the hatched space 12 shown in FIG. 14 such that no discharge occurs. Moreover, an element (component) 92 constituting the low voltage circuit 94 formed on the third substrate 91 is disposed apart from an element 15 constituting the high voltage direct current circuit 7 at a distance D or more. Furthermore, an element 92 is disposed apart from an element (component) 93 constituting the high voltage alternating current circuit 8 at a distance three times the distance D or more. In other words, the component constituting the low voltage circuit formed on the third substrate 91 is formed keeping a distance from the component mounted on the first substrate 2 under the same conditions as the second substrate 4. In other words, it can also be regarded that a plurality of the second substrates 4 is formed with the first substrate 2 sandwiched.

As described above, even in the case in which the area of the low voltage circuit is considerably larger than the area of the high voltage circuit and the low voltage circuit fails to be disposed in the region of the second substrate 4, it made possible to provide the multi-layer configuration of the printed wiring board, and it is possible to provide a small-sized, high-performance power supply module.

<Third Exemplary Modification>

In the following, as a third exemplary modification of the present embodiment, a unit that improves the noise resistance of a power supply module adopting a multi-layer structure substrate will be described.

Figure 11:
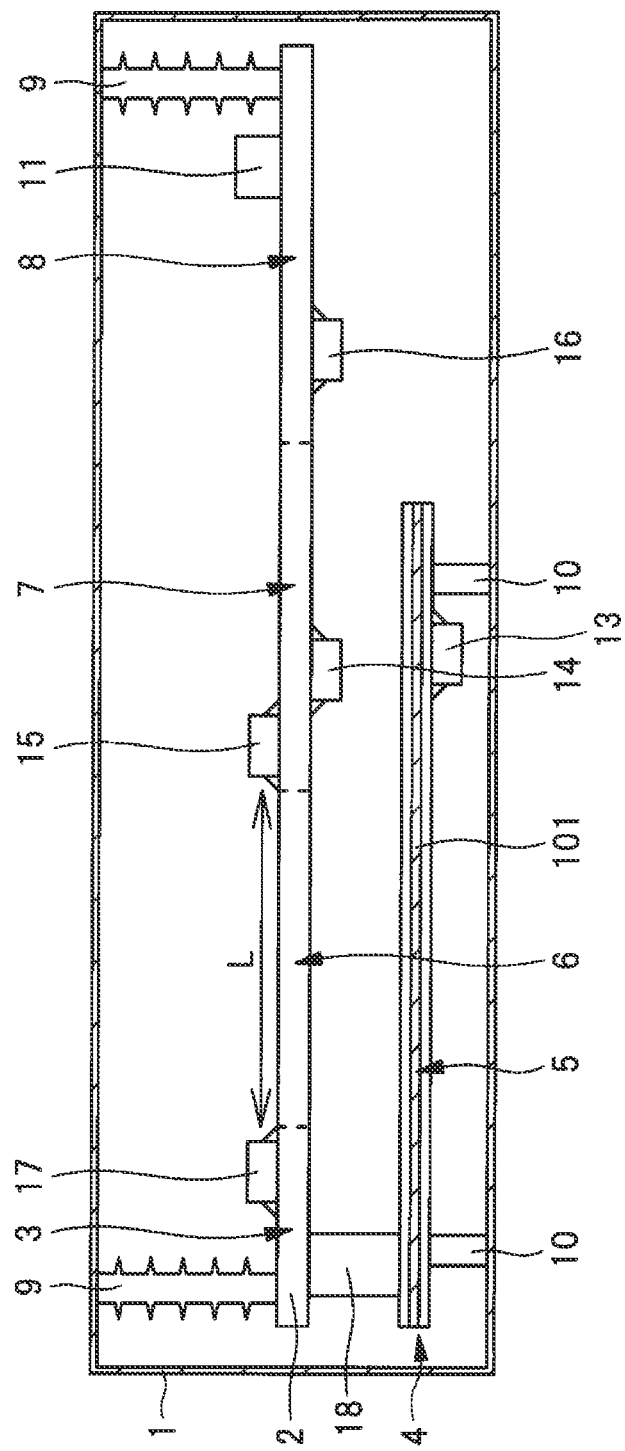
FIG. 11 is a partially broken side view showing a power supply module that is a third exemplary modification of the first embodiment of the present invention.

FIG. 11 shows a side view in which the power supply module of the present exemplary modification is partially broken. In plurality of substrates constituting a multi-layer structure in the power supply module of the present exemplary modification, a second substrate 4 has a metal layer (a shield plane layer and a ground plane layer) 101 connected, as an inner layer, to a ground potential. Moreover, the component constituting the low voltage circuit 5 formed on the second substrate 4 is disposed on the surface on the opposite side of the first substrate 2 in the surfaces of the second substrate 4. That is, the metal layer 101 lies between the first substrate 2 and the low voltage circuit 5. In other words, the metal layer 101 lies between the component constituting the low voltage circuit 5 (e.g., the element 13) and the component constituting the high voltage alternating current circuit 8. Here, the metal layer 101 is sandwiched between two substrates constituting the second substrate 4. However, the surface on the first substrate 2 side of the metal layer 101 may be exposed. The metal layer 101 is made of copper foil, for example, electrically grounded. In order to easily understand the drawing, in FIG. 11, the metal layer 101 is hatched.

As described above, the metal layer 101 that reduces electromagnetic radiation is provided between the low voltage circuit 5 of the second substrate 4 and the first substrate 2 including the high voltage alternating current circuit 8 that is a noise source, and thus it is possible to reduce electromagnetic radiation superposed on the low voltage circuit 5. That is, it is possible to achieve a small-sized power supply module that improves the resistance against electromagnetic radiation noise from a high voltage alternating current circuit.

Moreover, the present exemplary modification may be applied to the second exemplary modification. In other words, the metal layer may be provided on each of a plurality of substrates provided being overlapped with a substrate including a high voltage alternating current circuit.

Furthermore, the metal layer 101 may have a stacked structure formed by overlapping a plurality of metal layers. In this case, it is possible to improve shield effect.

<Fourth Exemplary Modification>

Figure 12:
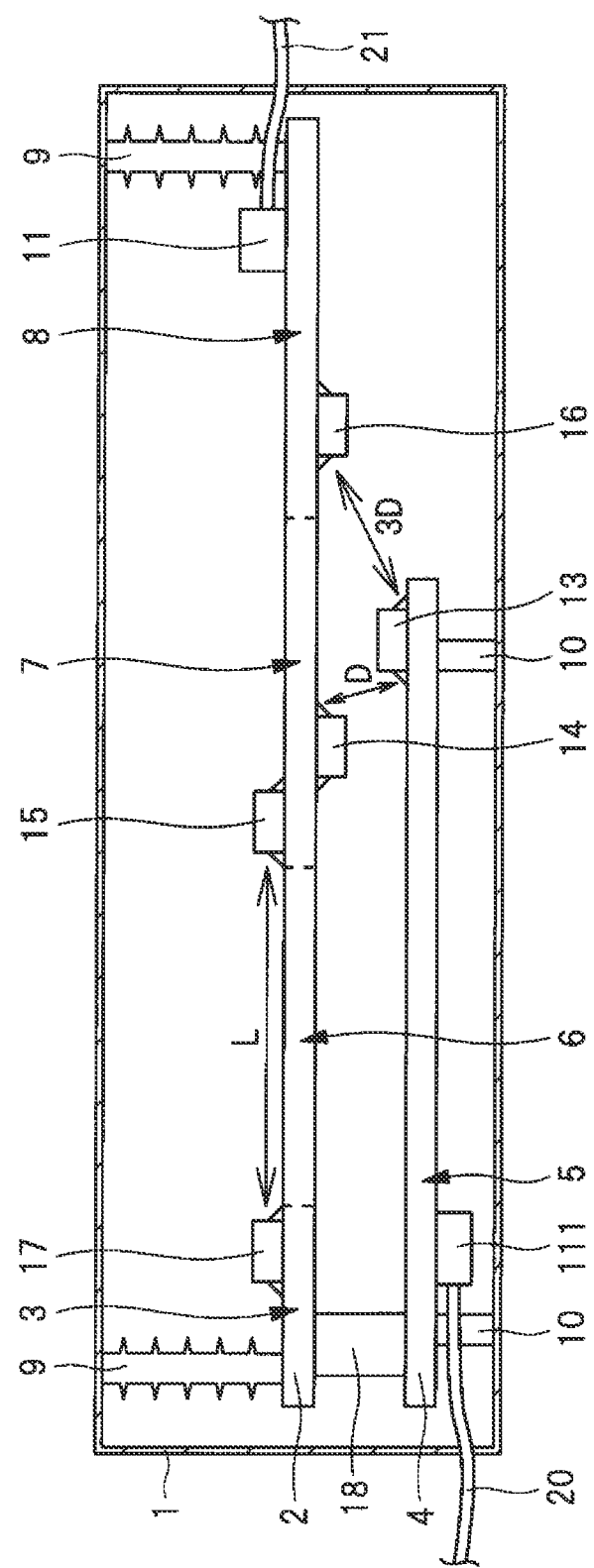
FIG. 12 is a partially broken side view showing a power supply module that is a fourth exemplary modification of the first embodiment of the present invention.

In the following, as a fourth exemplary modification of the present embodiment, a method of improving the safety of a power supply module will be described. FIG. 12 shows a side view in which a power supply module of the present exemplary modification is partially broken. Here, a protection circuit is formed in a low voltage circuit 3 of a first substrate 2. The protection circuit protects the high voltage circuit, i.e., the direct current circuit and the alternating current circuit.

Thus, in the case in which the wire a control signal of the high voltage circuit output from a second substrate 4 to the first substrate 2 is broken due to a failure in a substrate-to-substrate connecting unit 18, the protection circuit allows the high voltage circuit of the first substrate 2 to be stopped.

Moreover, here, a terminal 111 that receives a voltage from the external power supply of the power supply module to the power supply module is disposed on a substrate (e.g., the second substrate 4) other than the first substrate 2. Accordingly, in the case in which the power supply wire of the power supply module is broken due to a failure in the substrate-to-substrate connecting unit 18, electric power supply to the first substrate 2 is lost and the operation of the high voltage circuit is stopped.

As described above, even though communication is faulty between the high voltage circuit and the low voltage control circuit of the second substrate 4 due to a failure or a broken wire in substrate-to-substrate connecting unit 18 between the first substrate 2 and the second substrate 4, it is possible to safely disconnect the power supply source by the protection circuit with no overdrive of the high voltage circuit.

Furthermore, FIG. 12 shows a cable 20 drawn from the terminal 111 to the outside of a metal case 1 and a cable 21 drawn from an output terminal 11 formed in the high voltage region to the outside of the metal case 1. The cable 20 is electrically connected to a low voltage circuit 5 through the terminal 111, and the cable 21 is electrically connected to a high voltage alternating current circuit 8 through the output terminal 11. The cables 20 and 21 are apart from a region between the first substrate 2 and the second substrate 4.

In other words, the cables 20 and 21 are not present between the first substrate 2 and the second substrate 4. Accordingly, it is possible to prevent an event that the cable 20 or 21 touches a component and the like mounted on the first substrate 2 or the second substrate 4 to cause a breakage at any place and this causes a failure such as a short circuit. Moreover, the cable 20 or 21 is present between the first substrate 2 and the second substrate 4, and thus it is possible to prevent discharge from the high voltage alternating current circuit 8 to the cables 20 and 21 or the second substrate 4.

<Fifth Exemplary Modification>

In the power supply module described with reference to FIG. 1, a circuit in which the voltage of the electrical signal is less than 300 V is referred to as the low voltage circuit, and a circuit in which the voltage is 300 V or more is referred to as the high voltage circuit. However, the high voltage, the low voltage, the direct current, and alternating current may be distinguished based on numerical values different from the numerical values described above.

For example, as a first example, in the case of the alternating current circuit, a circuit in which the voltage is 600 V or less may be referred to as the low voltage circuit, and a circuit in which the voltage exceeds 600 V may be referred to as the high voltage circuit. At this time, in the case of the direct current circuit, a circuit in which the voltage is 750 V or less may be referred to as the low voltage circuit, and a circuit in which the voltage exceeds 750 V may be referred to as the high voltage circuit.

Moreover, as a second example, the high voltage and the low voltage may be defined in conformance with the international standard such as IEC (International Electrotechnical Commision).

Furthermore, as a third example, in the case of the alternating current circuit, a circuit in which the voltage is 1,000 V or less may be referred to as the low voltage circuit, and a circuit in which the voltage exceeds 1,000 V may be referred to as the high voltage circuit. At this time, in the case of the direct current circuit, a circuit in which the voltage is 1,500 V or less may be referred to as the low voltage circuit, and a circuit in which the voltage exceeds 1,500 V may be referred to as the high voltage circuit.

Second Embodiment

Figure 13:
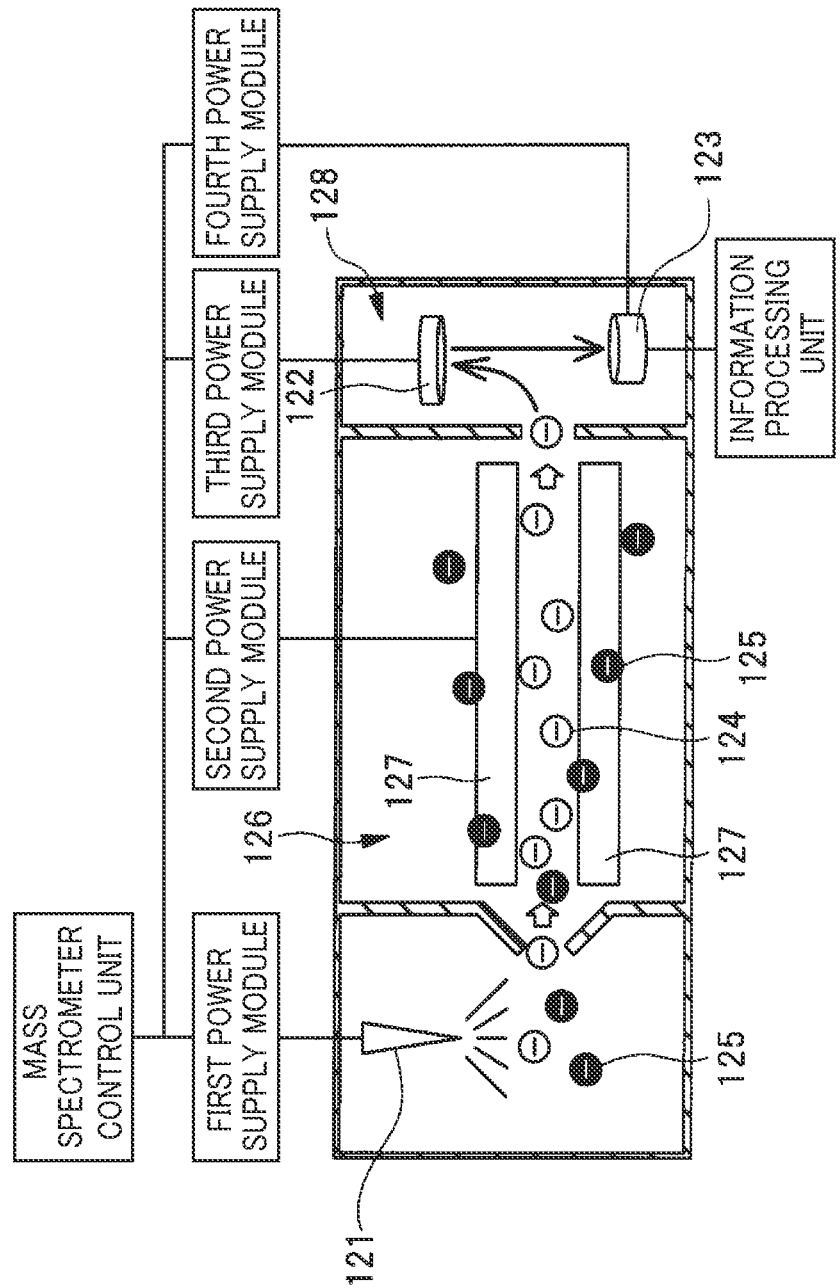
FIG. 13 is a schematic diagram showing of a mass spectrometer that is a second embodiment of the present invention.

In FIG. 12, FIG. 13 shows a schematic diagram of a mass spectrometer that is a second embodiment. In the following, a description will be made that the power supply module described in the first embodiment is used for the power supply source of the mass spectrometer. The mass spectrometer is a device used for examining types or amount of atoms constituting a sample, for example.

The mass spectrometer of the present embodiment includes an ion source 121 that ionizes a sample to be a target for mass spectrometric analysis and a mass separating unit 126 that filters unnecessary ion molecules 125 in the ionized sample with a filter electrode 127 and transmits only ion molecules 124 having a mass targeted for analysis. The mass spectrometer further includes a track control unit 128 that controls tracks on which the ion molecule and the electrons move, a conversion dynode 122 that converts the ion molecules into electrons, and a detector 123 that detects the electrons. The conversion dynode 122 and the detector 123 are disposed in the track control unit 128. The mass spectrometer further includes an information processing unit that calculates a mass from electrical signals obtained from the detector 123. Here, the mass spectrometer includes a first power supply module that applies a voltage to the ion source 121, a second power supply module that applies a voltage to the filter electrode 127, a third power supply module that applies a voltage to the conversion dynode 122, and a fourth power supply module that applies a voltage to the detector 123. Furthermore, the mass spectrometer has a mass spectrometer control unit that controls the first to the fourth power supply modules at high voltage.

The power supply module installed on the mass spectrometer according to the present invention has one configuration or a plurality of configuration in any of configurations of the first embodiment and the first to the fifth exemplary modifications of the first embodiment. In the case in which an equivalent voltage only has to be applied to the components constituting the mass spectrometer, the power supply module as the power supply source may be one. However, actually, it is necessary to supply different voltages to the components of the mass spectrometer due to a multifunctional mass spectrometer, and the number of power supply modules to be installed on the mass spectrometer correspondingly to these voltages.

In the present embodiment, the power supply module of the first embodiment is used for the power supply source of the mass spectrometer, and thus it is possible to provide a small-sized mass spectrometer even in the case in which the number of power supply modules to be installed on the mass spectrometer increases. Moreover, the detection sensitivity of the mass spectrometer is greatly affected by an amount of noise in the power supply module. As a result, the power supply module having the noise reduction unit, which is described in the first exemplary modification or the third exemplary modification of the first embodiment, is installed, and thus it is possible to provide a mass spectrometer of high sensitivity.

As described above, the invention made by the present inventors is described specifically based on the embodiments. However, the present invention is not limited to the embodiments, and can be modified variously without deviating from the gist of the present invention.

For example, to the power supply module of the present specification, combinations of a plurality of configurations in the first to the fifth exemplary modifications of the first embodiment may be applied. Moreover, the comparative example may be combined with the first to the fifth exemplary modifications of the first embodiment.

INDUSTRIAL APPLICABILITY

The present invention is usable widely to power supply modules and mass spectrometers.

REFERENCE SIGNS LIST

1: metal case
2: first substrate
3, 5: low voltage circuit
3D, D, L: distance
4: second substrate
7: high voltage direct current circuit
8: high voltage alternating current circuit
18: substrate-to-substrate connecting unit

What is claimed is:

1. A power supply module comprising
a first substrate and a second substrate that are overlapped with each other in a planar view,
wherein: the first substrate has
  a first region in which a first circuit is formed,
  a second region in which a direct current circuit that operates at a voltage higher than a voltage of the first circuit is formed,
  a third region in which an alternating current circuit that operates at a voltage higher than the voltage of the first circuit is formed,
  a fifth region including the direct current circuit and the alternating current circuit, and
  a sixth region that is located between the first region and the fifth region in which a wiring pattern is not mounted on a surface of the first substrate;
the second substrate has
  a fourth region in which a second circuit that operates at a voltage lower than the voltages of the direct current circuit and the alternating current circuit;
wherein a shortest distance from the first region to the fifth region in a direction along a surface of the first substrate is L and a shortest distance at which space discharge does not occurs from a component that constitutes the direct current circuit to a component that constitutes the second circuit is D, a shortest distance from a component that constitutes the alternating current circuit to the component that constitutes the second circuit is three times the distance D or more; and
the distance L is greater than three times the distance D.

2. The power supply module according to claim 1,
wherein: an amplitude of a first voltage of an electrical signal carried through the alternating current circuit is 300 V or more;
an amplitude of a second voltage of an electrical signal carried through the direct current circuit is less than 300 V and a maximum absolute value of the second voltage is 300 V or more;
an amplitude of a third voltage of an electrical signal carried through the first circuit is less than 300 V and a maximum absolute value of the third voltage is less than 300 V; and
an amplitude of a fourth voltage of an electrical signal carried through the second circuit is less than 300 V and a maximum absolute value of the third voltage is less than 300 V.

3. The power supply module according to claim 1, wherein a shortest distance from a component mounted on the first substrate to the component that constitutes the second circuit is smaller than three times the distance D.

4. The power supply module according to claim 1, wherein the component that constitutes the alternating current circuit and the component that constitutes the second circuit are apart from each other in a planar view.

5. The power supply module according to claim 1, further comprising
a metal case that is electrically grounded,
wherein the first substrate and the second substrate are accommodated in an inside of the metal case and fixed to the metal case through an insulating spacer.

6. The power supply module according to claim 5, wherein no resin is packed between the metal case and the first substrate or the second substrate and between the first substrate and the second substrate.

7. The power supply module according to claim 5, wherein a shortest distance from the metal case to the component that constitutes the alternating current circuit is three times the distance D or more.

8. The power supply module according to claim 5, further comprising
a cable that is electrically connected to the second circuit and that is drawn to an outside of the metal case,
wherein the cable is apart from a seventh region between the first substrate and the second substrate.

9. The power supply module according to claim 1,
wherein: the first circuit is electrically connected to a first ground;
the second circuit is electrically connected to a second ground;
the direct current circuit or the alternating current circuit is electrically connected to a third ground; and
the third ground is electrically connected to the first ground and to the second ground through a noise reduction component.

10. The power supply module according to claim 1, wherein a mounting surface of the first substrate and a mounting surface of the second substrate are in parallel with each other.

11. The power supply module according to claim 1, wherein a plurality of the second substrates is formed sandwiching the first substrate.

12. The power supply module according to claim 1, wherein in the first region, a protection circuit configured to protect the direct current circuit and the alternating current circuit is installed.

13. The power supply module according to claim 1, further comprising
a cable that is connected to an external power supply of the power supply module,
wherein the cable is electrically connected to the second circuit.

14. The power supply module according to claim 1, further comprising
a metal layer that is interposed between the component that constitutes the second circuit and the component that constitutes the alternating current circuit,
wherein the metal layer is electrically grounded.

15. A mass spectrometer comprising:
an ion source configured to ionize a sample;
a filter electrode configured to screen a detection target ion;
a track control unit configured to control a moving track of an ion and a moving track of an electron;
a conversion dynode configured to detect the ion and convert the ion into an electron; and
a detector configured to detect the electron,
wherein: the conversion dynode and the detector are disposed on the track control unit; and
the power supply module according to claim 1 is used as a first power supply of the ion source, a second power supply of the filter electrode, a third power supply of the conversion dynode, or a fourth power supply of the detector.

* * * * *